United States Patent

Ruetsch et al.

[11] 4,231,054
[45] Oct. 28, 1980

[54] THYRISTOR WITH STARTING AND GENERATING CATHODE BASE CONTACTS FOR USE IN RECTIFIER CIRCUITS

[75] Inventors: Christian Ruetsch, Turgi; Roland Sittig, Umiken, both of Switzerland

[73] Assignee: BBC Brown, Boveri & Company, Limited, Baden, Switzerland

[21] Appl. No.: 41,332

[22] Filed: May 22, 1979

[30] Foreign Application Priority Data

Jun. 15, 1978 [CH] Switzerland .................. 6522/78

[51] Int. Cl.² .......................................... H01L 29/74
[52] U.S. Cl. ...................................... 357/38; 357/51; 357/55; 357/86; 307/252 G; 307/252 K
[58] Field of Search ................. 357/38, 51, 55, 86; 307/252 G, 252 K

[56] References Cited

U.S. PATENT DOCUMENTS

| | | | |
|---|---|---|---|
| 3,097,335 | 7/1963 | Schmidt | 357/38 |
| 3,364,440 | 1/1968 | Schreiner | 357/38 |
| 3,486,088 | 12/1969 | Gray et al. | 357/51 |
| 3,670,217 | 6/1972 | Boksjo et al. | 357/55 |
| 3,740,584 | 6/1973 | McIntyre et al. | 307/252 G |

Primary Examiner—Joseph E. Clawson, Jr.
Attorney, Agent, or Firm—Oblon, Fisher, Spivak, McClelland & Maier

[57] ABSTRACT

An output thyristor with at least two electrodes located on the cathode side base zone, whereby one of the two electrodes is used as a control electrode (starting gate) and the second electrode is used for the output of current (generator gate), wherein the existing lateral resistance $R_{GK}'$ between the generator gate and the cathode zone and/or the edge length of the generator gate is selected such that at the generator gate of the started thyristor, with an anode current which is smaller than the surge limit of the thyristor in question, the current $I_G$ removable therefrom is sufficient when applied to the starting gate of a corresponding thyristor connected in parallel to start the parallel connected thyristor. The lateral resistance between the starting gate and the cathode zone—$R_{GK}$—is selected as small as possible ($R_{GK} < R_{GK}'$) so that the starting voltage on the starting gate can act directly on the semiconductor junction between the thyristor cathode zone and the cathode base zone.

8 Claims, 5 Drawing Figures

THYRISTOR WITH STARTING AND GENERATING CATHODE BASE CONTACTS FOR USE IN RECTIFIER CIRCUITS

BACKGROUND OF THE INVENTION

1. Field of the Invention

The invention relates to an output thyristor with at least two electrodes placed on the base area of the cathode side, wherein one of the two electrodes serves as control electrode (ignition or starting gate) and the second electrode serves as the discharge of a current (the generator gate). This invention further relates to use of this kind of thyristor in rectifier circuits in which several thyristors are connected in parallel.

2. Description of the Prior Art

In large plants in the power electronics industry frequently several thyristors must be connected in parallel. It is possible that in unfavorable usage conditions, individual thyristor elements might not ignite or start or might become non-conductive because of low current. Then, with a subsequent increase in current the thyristors connected to the non-conductive thyristor could be overloaded and destroyed. To avoid such accidents, presently relatively expensive measures must be taken in the connections (cf. e.g. DE-OS 26 12 549).

From DE-OS 21 46 178 there is now known a thyristor on whose cathode side base area are provided several electrodes. An amplifying gate (auxiliary thyristor) directs currents free of the boundary layer over several ignition electrodes distributed over the upper surface of the thyristor to ensure a symmetrical ignition procedure. One of the amplifying gates of the ignited chief thyristor's output current will not suffice to start a corresponding thyristor connected in parallel.

SUMMARY OF THE INVENTION

Accordingly, one object of this invention is to provide a novel thyristor whose ignition and generator gates are dimensioned in such a fashion that the generator current emitted from a started thyristor is sufficient to start a corresponding unconnected thyristor. In this the anode current of the ignited thyristor, $J_o$, should be smaller than its impulse current or surge limit value, but preferably smaller than three times the continuous current limit.

This and other objects are achieved by providing a novel output thyristor with at least two electrodes located on the cathode side base zone, whereby one of the two electrodes is used as a control electrode (starting gate) and the second electrode is used for the output of current (generator gate), characterized by the fact that the existing lateral resistance $R_{GK}'$ between the generator gate and the cathode zone and/or the edge length of the generator gate is selected such that at the generator gate of the started thyristor—with an anode current which is smaller than the surge limit of the thyristor in question—the removable current $I_G$ is sufficient to start a corresponding thyristor in parallel over its starting gate, and that the lateral resistance between the starting gate and the cathode zone—$R_{GK}$—is selected as small as possible ($R_{GK} < R_{GK}'$) so that the starting voltage on the starting gate can act directly on the cathode side emitter crossing, $J_1$.

The output thyristor may be provided with emitter short circuits between the lateral resistances $R_{GK}'$ or $R_{GK}$ which are located between the generator gate or starting gate and cathode zone so that both the following relations hold:

$$\frac{R_{GK}}{R_{GK}'} \leq \frac{1}{3}$$
$$I_G' \cdot R_{GK} \leq 0.2 V$$

$I_G' \cdot R_{GK} \leq 0.2$ V wherein $I_G'$ indicates the minimum gate current with which the thyristor will still start.

In a preferred embodiment, the starting gate and the generator gate are located near one another, and the contact of the gates takes place over a thin edge area oriented toward the cathode, under which the edge concentration of the cathode base zone is greater than in the area between the gate and the cathode zone. The thyristor further includes between the remaining part of the gate and the base zone a 500 to 2000 Å thick layer of insulation. Parallel to the part of the gate which is insulated from the cathode base zone there is a lamellar emitter short circuit.

Proceeding from a specified thyristor structure, the desired starting sensitivity of the thyristor starting gate is obtained through lessening of the existing lateral resistance $R_{GK}$ between the gate and the cathode zone, and the required generator current is obtained through increasing the corresponding lateral resistance $R_{GK}'$ and/or through lengthening of the edge of the generator gate. Furthermore, the lateral resistance $R_{GK}'$ between the generator gate and the cathode zone is increased by etching in this area of the cathode base zone a groove of some 30 to 40 μm depth.

Several of the above-described thyristors are used in a rectifier circuit, in which the thyristors are connected in parallel, whereby the generator gate of one is connected directly with the starting gate of the next thyristor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
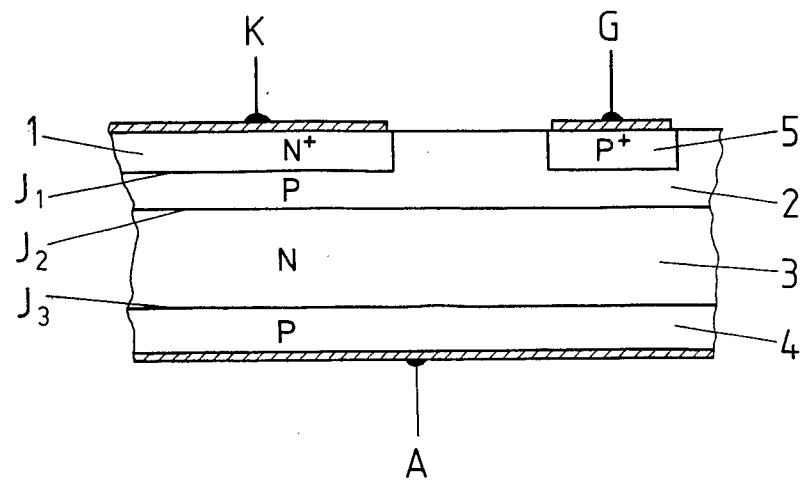
FIG. 1 is a schematic cross-sectional view of a known thyristor.

Referring now to the drawings, wherein like reference numerals designate identical or corresponding parts throughout the several views, and more particularly to FIG. 1 thereof, a thyristor is presented whose cathode-, P-base-, N-base-, and anode zone are indicated by 1, 2, 3 and 4. The existing semiconductor junctions are indicated with $J_1$, $J_2$, and $J_3$. The cathode- and anode zones are provided with the contacts K and A, and the P-base zone with the gate G. Under the gate G the P-basis zone 2 exhibits a higher (P+) doping than under the cathode zone 1.

If the gate is to work as an ignition or starting gate, then the lateral resistance between the gate and cathode zone 1 must be as small as possible, because then the decaying voltage over this resistance is small and the voltage existing at the gate works directly on the junction $J_1$. Preferably the decaying voltage drop across the resistance $R_{GK}$ with the minimal starting current $I_G'$ should amount to less than 0.2 V. The thyristor then ignites with a small anode voltage. In order to make the resistance $R_{GK}$ as small as possible, the distance between gates, or the gateside edge of the P+-zone 5 and the gateside edge of the cathode zone 1 is made as small as possible. A further possibility of raising the sensitivity lies in selecting the cathode side gateside edge as short as possible.

Figure 2:
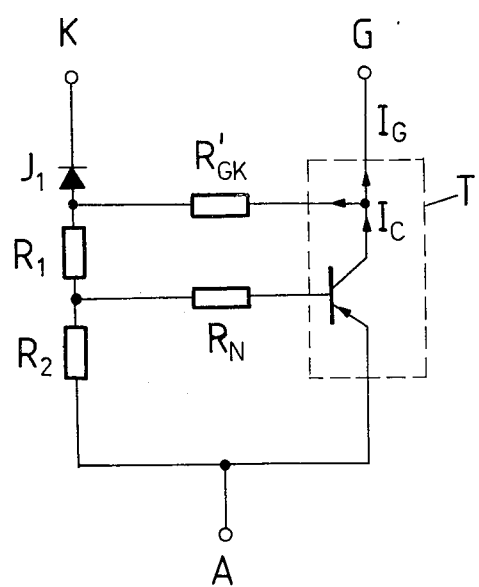
FIG. 2 is an equivalent circuit diagram of a thyristor of FIG. 1 in the started condition.

Otherwise, as in the case of the starting gate, one should note with the dimensioning of the generator gate that the existing lateral resistance between the gate, or the P+-zone, and the cathode zone 1—$R_{GK}'$—should be selected as large as possible. At the least $R_{GK}'$ should be three times greater than $R_{GK}$. This should be explained in the equivalent circuit diagram of a started thyristor presented in FIG. 2. Accordingly the started thyristor between cathode contact K and anode contact A consists of two characterizing resistances, $R_1$ and $R_2$, one a diode polarized in the direction of flux through the crossing $J_1$, and two, the non-reactive voltage drop in the flooded area (P- and N-base zones 2 and 3). On the other hand, between gate G and anode A is a pure transistor structure. This transistor T is controlled through the lateral electron current in the N-base 3 through a corresponding resistance $R_N$. As soon as the collector-emitter voltage in the thyristor exceeds the saturation voltage $U_{sat}$, a constant collector current $I_c$ flows. The current $I_G$ removable from gate G is then:

$$I_G = I_c - \frac{U_{GK} - U_{J1}}{R_{GK}'}$$

Depending on the size of the resistance $R_{GK}'$ in the P-base zone 2, a further current superimposes itself on the collector current $I_c$. A raising of the generator current $I_G$, obtained by selection of a longer gate edge, is also possible in principle, by selecting a sufficiently large resistance and/or collector current $I_c$. One obtains a large value for $I_c$ especially when the current $J_o$ flowing through the thyristor is selected correspondingly large, since $I_c \sim \sqrt{j_o}$; where $j_o$ signifies the current density of the started thyristor underneath the cathode. For large resistance values $R_{GK}'$ the gate in an ideal case can deliver the current $I_c$ with a voltage of $U_{AK} - U_{sat}$.

From the explanations above it follows that it would be hardly reasonable with thyristors connected in parallel to use only a single gate at any one time and to connect these to one another because the requirements of large generator currents or high starting sensitivities lead either to opposing solutions (greater or lesser resistances $R_{GK}$; long or short edge length of the gates) or to require currents $J_o$ which can amount to a multiple of the rated current. The latter is allowed only rarely to be realized, because the danger exists that the started thyristor will be destroyed. This happened by way of example to a thyristor obtained commercially with a central gate and an edge length of 2.4 cm., with a required starting current of 415 mA. The generator current $I_G$ on the other hand, with a current $J_o$ of 1500 A ($j_o \approx 100$ A/cm), itself amounted only to 240 mA and was not sufficient to start a corresponding thyristor connected in parallel.

Figure 3:
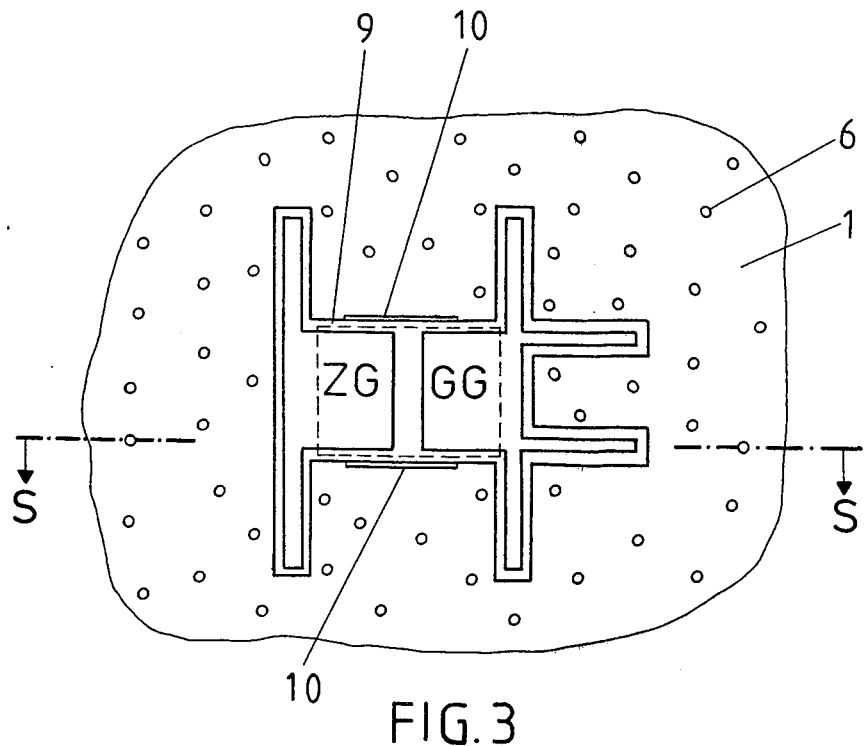
FIG. 3 is a top view of a thyristor of the model of the invention (without metalizing of the cathode)
Figure 4:
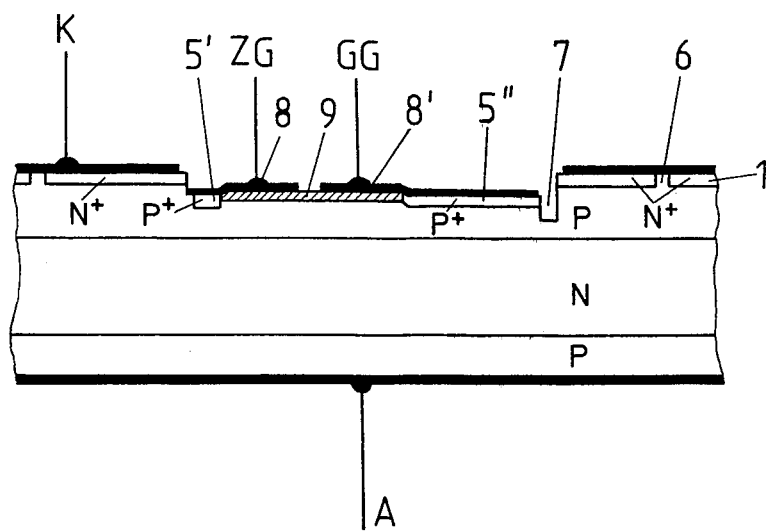
FIG. 4 is a cross-sectional view of the thyristor of the type shown in FIG. 3 taken along profile line S-S.

In FIGS. 3 and 4 this thyristor is presented with an altered gate structure. Neither the emitter short circuits designated by the numeral 6 nor the potential or measurements of zones 3 and 4 were altered. On the other hand, the central gate was replaced by the two gates next to one another, the starting gate ZG and the generator gate GG. The edge length of the starting gate ZG amounts to 1 cm and the length of the generator gate GG is just about double that. The resistance between starting gate ZG and cathode zone 1 was reduced from the original 300 μm to 50 to 100 μm. For starting, there then suffices a gate voltage of 1 V with a starting current of only 175 mA.

The distance between the gate and cathode, measured from the cathode side edge of the P+-zone 5″ up to the gate side edge of the cathode zone 1, is 100 to 200 μm. To raise the corresponding resistance $R_{GK}'$ is required an additional etching of groove 7 in the P-base 2. A depth of 30 to 40 μm. is sufficient for the groove. This etching offers the advantage that the resistance $R_{GK}'$ can be raised dramatically without increasing the distance of the gates from the cathode zone.

For contact, gates 8, 8' of metallized plane surfaces lying next to one another are sufficient. For the thyristor these areas are fully passive. To insulate along the P-base 2, the metallizing on a thin layer of oxide (1500 to 2000 Å) 9 is used. The current surge which results from a voltage climb in this region can be directed over the neighboring short circuit 10 to the cathode.

Figure 5:
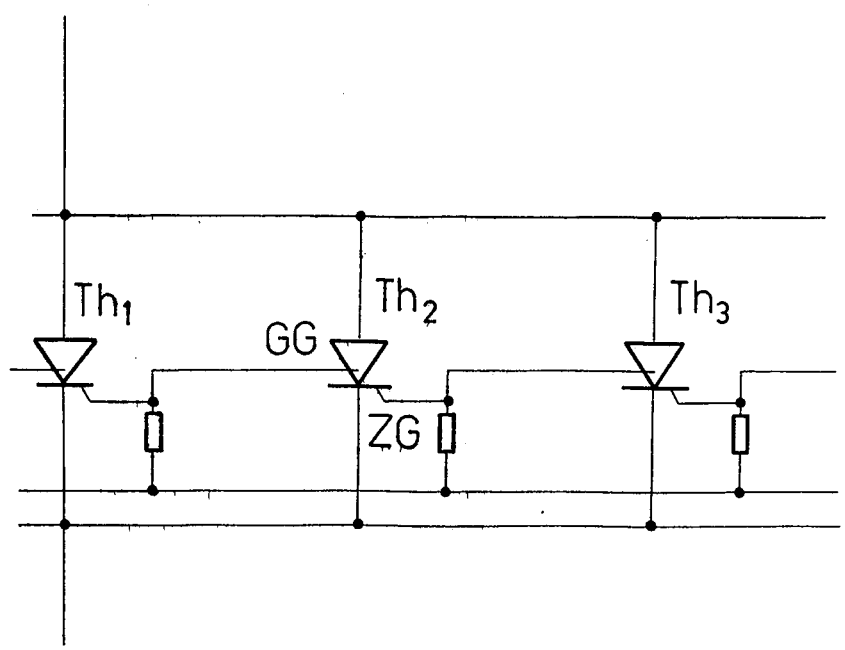
FIG. 5 is a schematic circuit illustration of several thyristors according to the invention, connected in parallel.

As can be seen from FIG. 5, for linking several thyristors in parallel—$Th_1$, $Th_2$, $Th_3$—the generator gate GG of one can be connected directly with the starting gate ZG of the next thyristor.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An output thyristor connected to an operating circuit and fired by a controlling circuit, said thyristor having at least four semiconductor zones of alternating conductivity type, including a cathode zone, a cathode-base zone, an anode-base zone and an anode zone, said thyristor further having at least two electrodes formed on the cathode base zone, including a starting gate used to control firing of said thyristor and a generator gate used to generate an output current upon firing of said thyristor, said operating circuit supplying anode current and voltage to said thyristor and said controlling circuit supplying starting voltage and current to said starting gate, comprising:

said thyristor having a lateral resistance $R_{GK}'$ between the generator gate and the cathode zone thereof formed such that while conducting an anode current smaller than a surge limit of said thyristor, sufficient current is removable from said generator gate such that said output thyristor can be adapted to ignite a corresponding thyristor connected in parallel therewith by application of the removable current from the output thyristor to a starting gate of the corresponding thyristor; and said output thyristor having a lateral resistance $R_{GK}$ between the starting gate and cathode zone sufficiently small, with $R_{GK} < R_{GK}'$, so that a starting voltage applied to the starting gate thereof acts directly on the semiconductor junction between the cathode and the cathode base zones.

2. An output thyristor according to claim 2, wherein said generator gate has an edge length selected so that the lateral resistance $R_{GK}'$ between the generator gate and the cathode zone is such that when said output thyristor is conducting anode current smaller than the surge limit of said output thyristor, sufficient gate current is removable from said generator gate such that said output thyristor can be adapted to ignite the corresponding thyristor connected in parallel therewith.

3. An output thyristor according to claim 1 or claim 2, further comprising:

emitter short circuits formed between the lateral resistances $R_{GK}'$ and $R_{GK}$, wherein both the following relations hold:

$$\frac{R_{GK}}{R_{GK}'} \leq \frac{1}{3}$$
$$I_{G'} \cdot R_{GK} \leq 0.2V$$

$I_{G'} \cdot R_{GK} \leq 0.2V$ wherein $I_{G'}$ indicates the minimum gate current with which the output thyristor will still start.

4. An output thyristor according to claim 1 or claim 2, further comprising:

said starting gate and said generator gate located near one another;

said starting gate and said generator gate having electrode contacts located over respective thin edge areas oriented toward the cathode, under which the edge concentration of the cathode base zone is greater than in the area between the gates and the cathode zone; and a 500 to 2000 Å thick layer of insulation formed between the remaining parts of the gates and the cathode base zone.

5. An output thyristor according to claim 4, further comprising:

a lamellar emitter short circuit formed parallel to the part of the gate which is insulated from the cathode base zone.

6. A thyristor according to claim 2 wherein a desired starting sensitivity of the starting gate is obtained through lessening of the existing lateral resistance $R_{GK}$ between the starting gate and the cathode zone; and a predetermined generator current is obtained through increasing the corresponding lateral resistance $R_{GK}'$ and/or through lengthening of the edge of the generator gate.

7. A thyristor according to claim 5, further comprising:

an etched groove having a depth of 30 to 40 μm formed in the cathode base zone between said generator gate and said cathode zone to increase $R_{GK}'$.

8. A rectifier circuit comprising:

plural output thyristors, each thyristor having at least four zones of alternating conductivity type, including a cathode zone, a cathode-base zone, an anode-base zone and an anode zone, each said thyristor further having at least two electrodes formed on the cathode base zone, including a starting gate used to control firing of said thyristor and a generator gate used to generate an output current upon firing of said thyristor;

each of said plural thyristors connected in parallel with respective anodes and cathodes connected to each other, and with the generator gate of selected thyristors connected to the starting gate of other selected thyristors;

wherein each thyristor further has a lateral resistance $R_{GK}'$ between the generator gate and the cathode zone thereof formed such that while conducting an anode current smaller than a surge limit of said thyristor, sufficient current is removable from said generator gate such that said selected thyristor ignites the other selected thyristor connected in parallel therewith by application of the removable generator gate current to the starting gate of the other selected thyristor; and wherein each said output thyristor has a lateral resistance $R_{GK}$ between the starting gate and cathode zone sufficiently small with $R_{GK} < R_{GK}'$, so that a starting voltage applied to the starting gate thereof acts directly on the semiconductor junction between the cathode and the cathode base zones thereof.

* * * * *